(12) United States Patent
Sim

(10) Patent No.: US 7,003,041 B2
(45) Date of Patent: Feb. 21, 2006

(54) DEVICE AND METHOD FOR DECODING TURBO CODES

(75) Inventor: Myung Sub Sim, Seoul (KR)

(73) Assignee: LG Electronics Inc., Seoul (KR)

( * ) Notice: Subject to any disclaimer, the term of this patent is extended or adjusted under 35 U.S.C. 154(b) by 540 days.

(21) Appl. No.: 09/977,252

(22) Filed: Oct. 16, 2001

(65) Prior Publication Data

US 2002/0097816 A1    Jul. 25, 2002

(30) Foreign Application Priority Data

Oct. 16, 2000    (KR)    ................. 2000-60746

(51) Int. Cl.
*H04B 14/04*    (2006.01)
*H03D 1/00*    (2006.01)
*H03M 13/03*    (2006.01)

(52) U.S. Cl. ............... 375/242; 375/341; 714/792; 714/794

(58) Field of Classification Search ............... 375/242, 375/262, 265, 340, 341; 704/233, 245; 714/209, 714/776, 786, 793–796
See application file for complete search history.

(56) References Cited

U.S. PATENT DOCUMENTS

| 6,128,765 | A  | * | 10/2000 | Ross at al. ................. 714/786 |
|---|---|---|---|---|
| 6,182,261 | B1 |   | 1/2001 | Haller et al. |
| 6,189,126 | B1 | * | 2/2001 | Ulmer et al. ............... 714/795 |
| 6,452,979 | B1 | * | 9/2002 | Ariel et al. ................. 375/265 |
| 6,580,767 | B1 | * | 6/2003 | Koehler et al. ............. 375/341 |
| 6,813,743 | B1 | * | 11/2004 | Eidson ....................... 714/795 |
| 6,829,313 | B1 | * | 12/2004 | Xu ............................. 375/341 |
| 2002/0094038 | A1 | * | 7/2002 | Okamura .................... 375/340 |
| 2004/0039769 | A1 | * | 2/2004 | Orio ........................... 708/530 |

OTHER PUBLICATIONS

Andrew J. Viterbi, "An Intuitive Justification and a Simplified Implementation of the MAP Decoder for Convolutional Codes"; IEEE Journal on selected areas in communications, vol. 16, No. 2, pp. 260-264, Feb. 1998.

* cited by examiner

Primary Examiner—Emmanuel Bayard
Assistant Examiner—Lawrence B. Williams
(74) Attorney, Agent, or Firm—Fleshner & Kim, LLP

(57) ABSTRACT

A method and apparatus for decoding turbo codes using a sliding window method is disclosed. In decoding a received sequence using a Maximum A Posteriori (MAP) algorithm, a learning by a backward processing is performed for a predetermined length and first resultant values of an L-symbol length sequence and second resultant values of a W-symbol length sequence calculated by a backward processing are stored. Third resultant values are calculated by a forward processing. The calculation of the third resultant values overlaps in time with the next learning. A decoding symbol output is determined using the third resultant values and the second resultant values of the previous window.

25 Claims, 2 Drawing Sheets

DEVICE AND METHOD FOR DECODING TURBO CODES

BACKGROUND OF THE INVENTION

1. Field of the Invention

The present invention relates to a mobile communication system and, more particularly, to a method of decoding turbo codes using a sliding window method.

2. Background of the Related Art

As is well known, turbo codes are generated by two (or more) recursive systematic convolutional encoders (RSCs) connected in parallel through an internal interleaver, and this coding method is used for transmitting data of a high data rate in the next generation mobile communication standard (3 GPP or 3 GPP2).

The turbo code processes a generated information bit sequence in the unit of a block. Especially in case of encoding a large information bit sequence, it is known that a very superior coding gain is obtained with respect to the convolutional codes and a very superior error correction capability is achieved by iteratively decoding simple component codes at a receiving end.

Recently, there has been proposed a relatively simple turbo decoding technique capable of supporting a high-speed data transmission under the mobile communication environment. In this structure, input code words alternately pass through two convolutional decoders and the complexity of the structure is greatly reduced.

However, in order to iteratively pass through the convolutional decoder, it is required that the outputs of the convolutional decoder are not hard-decision values of "0" or "1", but are soft-decision values corresponding to the rate of a probability that the output of the convolutional decoder is "0" or "1."

For this, there has been proposed a Maximum A Posteriori (MAP) decoding technique that calculates a posteriori probability values of information bits and performs the decoding so that the probability values become maximum.

Generally, an information source of the turbo codes is the "Markov process" that has a discontinuous time and quantified states. Accordingly, the information source can be expressed through a binary matrix diagram.

In the binary matrix, $S_k$ represents the state of an encoder at a time k and $x_k = x_{k,1}, k, x_{k,n}(x_k = \{0,1\})$ represents an output of the encoder whose code rate is 1/n. Here, the number of states $S_k = m$ (m=0,1,2, ... ,M−1) of the information source is M.

When the time is shifted from k−1 to k, an input bit $d_k$ of the turbo encoder changes the state $S_{k-1}$ of the encoder to $S_k$. A state sequence $S=(S_0, \ldots, S_T)$ of the information starts at time k=0 and ends at time k=T. The initial state $S_0$ of the encoder is 0.

The output sequence x of the turbo encoder is modulated by BPSK or QPSK and suffers fading in a discrete memory channel. Accordingly, the sequence received in the receiving end becomes $y=(y_1,k,y_k,k,y_T)$. Here, $Y_k=(y_{k,1},k,_{k,n})$.

As described above, the MAP algorithm is an algorithm for estimating the a posteriori probability of state shift of the information using the received sequence. The MAP algorithm calculates the a posteriori probability of information bits $P(d_k=1|y)$ and $P(d_k=0|y)$. Then, the output of the decoder can be finally obtained in the form of a log likelihood ratio (LLR), as expressed by equation 1.

$$L(d_k) = \log \frac{P(d_k = 1 | y)}{P(d_k = 0 | y)} \quad \text{[Equation 1]}$$

$$= \log \frac{\sum_{(m',m)\setminus d_k=1} P(S_{k-1} = m', S_k = m, y)}{\sum_{(m',m)\setminus d_k=0} P(S_{k-1} = m', S_k = m, y)}$$

The a posteriori probability $P(S_{k-1}=m', S_k=m,y)$ of the state shift of the information bits is obtained by the equation 2.

$$P(S_{k-1}=m',S_k=m,y)=P(S_{k-1}=m',y_{j<k})P(y_{j>k}|S_k=m)$$
$$P(S_k=m,y_k|S_{k-1}=m') \quad \text{[Equation 2]}$$

In equation 2, $y_{j<k}$ represents the received sequence from the initial time to time k−1 and $y_{j>k}$ represents the received sequence from time k+1 to the last time.

Also in equation 2, $P(S_{k-1}=m',y_{j<k})$ is defined as and $\alpha(S_{k-1})$ and $\alpha(S_k)$ is derived therefrom. $P(y_{j>k}|S_k=m)$ is defined as $\beta(S_k)$.

In order to obtain the optimum a posteriori probability, a predetermined period is required before $\beta(S_k)$ is obtained. This is called a learning period. $\beta(S_k)$ calculated after the learning period is used for determination of the output bits of the decoder.

Hereinafter, $\alpha(S_k)$ and $\beta(S_k)$ are called an alpha value and a beta value, respectively.

FIG. 1 is a timing diagram of the related art MAP decoding. The X-axis represents the flow of time, and especially represents which symbol each processor processes as the time flows. The symbol number of a forward processor is increased, and the symbol number of a backward processor is decreased. The slant-lined shading sections represent that the backward processor is in learning. The curved arrows represent the correlation between alpha 5,7 and beta 6,8 values required for the bit decision.

Referring to FIG. 1, two backward processors are used. One backward processor (e.g., the first backward processor 2) performs the learning while the other backward processor (e.g., the second backward processor 3) calculates the beta values required for the bit determination of the decoder.

Specifically, when one MAP decoding starts, the first backward processor 2 performs the learning process from 2L to 1L. During this learning process, the second backward processor 3 is in a standstill state. Here, L represents the length of the sliding window.

Thereafter, the first backward processor 2 calculates the beta values 6 from 1L to 0 and determines bits of the decoder from 1L to 0 using the alpha values 5 from 0 to 1L, which were previously calculated and stored. During the bit determination of the decoder, the second backward processor 3 performs the learning using symbols from 3L to 2L.

In the next sliding window section, the second backward processor 3 determines the bits of the decoder from 2L to 1L by calculating the beta values 8 from 2L to 1L. During this bit determination of the decoder, the first backward processor 2 performs the learning using symbols from 4L to 3L.

As can be seen in the decoder output block, the bit determination is performed in order from 1L to 0, and from 2L to 1L. A proper order is obtained through a last-in first-out (LIFO) process that stores L outputs at a time and reads them from the end.

The above-described process is explained in detail in 'A. J. Viterbi, "An intuitive justification and a simplified implementation of the MAP decoder for convolutional codes," IEEE Journal on Selected Areas in Communications, vol.16, no.2, February 1998.'

According to the conventional method as described above, the backward processing is performed twice with respect to almost all symbols. As a result, two times backward processing is required for each MAP decoding and this causes the amount of calculation and the power consumption to be increased. Thus, the use time of the radio mobile equipment that operates using a battery is reduced.

Also, in case that only one backward processor is used for reducing hardware resources, the decoding time is increased twice as much.

Also, if the learning process, forward processing, and backward processing are performed for the length of L, the characteristic that the coding is completed with $S_T=0$ at a trellis termination of the turbo codes cannot be sufficiently used. This causes the coding gain of the turbo codes to deteriorate.

Also, though the size of the memory for storing resultant values is small to the extent of depth 60* width 56 (in case of 3 GPP WCDMA turbo encoder), the depth of a generally used memory is much larger than this and this causes the waste of memory.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

Another object of the present invention is to provide a device and method of decoding turbo codes that requires a small amount of calculation.

A further object of the present invention is to provide a device and method for decoding turbo codes that uses a small-sized memory.

A further object of the present invention is to provide a device and method for decoding turbo codes that uses one backward processor.

A further object of the present invention is to provide a device and method for decoding turbo codes that is suitable for increasing a coding gain.

A further object of the present invention is to provide a device and method for decoding turbo codes trellis termination at maximum.

A further object of the present invention is to provide a device and method of decoding turbo codes that is suitable for reducing a decoding time.

To achieve these objects and other advantages and in accordance with the purpose of the invention, as embodied and broadly described herein, an MAP decoder at a receiving end that performs an iterative decoding includes a backward processor for calculating first resultant values that are state probability values, after a reference number of a received sequence for an L bit length of the received sequence, and calculating and storing second resultant values that are state probability values, after the reference number of the received sequence for a W bit length of a next received sequence; a forward processor for calculating third resultant values that are state probability values, before the reference number of the received sequence, simultaneously with calculation of the first resultant values of the next window; a memory for storing in order the second resultant values and outputting in a reverse order the second resultant values; and an output determination module for determining output values of the received sequence using the calculated third resultant values and the outputted second resultant values of the previous window.

Preferably, the memory stores the second resultant values by alternately using increasing addresses and decreasing addresses and outputs the second resultant values by alternately using the decreasing addresses in symmetry with the write and the increasing addresses.

Exceptionally, the first resultant values firstly calculated from the received sequence are calculated in the reverse order from bits (i.e., L+the remainder obtained by dividing the length of the received sequence by W) and the second resultant values firstly calculated from the received sequence are calculated in the reverse order from the received sequence for a length of the remainder obtained by dividing a length of the received sequence by W to be stored in the reverse order. Also, the third resultant values firstly calculated from the received sequence are calculated in order from the received sequence for a length of the remainder obtained by dividing the length of the received sequence by W.

Preferably, the output values of the received sequence are determined in a manner that the second resultant values outputted in the reverse order becomes in the same order as the third resultant values calculated in order.

In another aspect of the present invention, a method of performing an MAP turbo decoding at a receiving end that performs an iterative decoding, includes the steps of calculating first resultant values that are state probability values after a reference number of a received sequence for an L bit length of the received sequence and calculating and storing second resultant values that are state probability values after the reference number of the received sequence for a W bit length of a next received sequence; calculating third resultant values that are state probability values before the reference number of the received sequence simultaneously with calculation of the first resultant values of the next window; storing in order the second resultant values and outputting in a reverse order the second resultant values; and determining output values of the received sequence using the calculated third resultant values and the outputted second resultant values of the previous window.

Preferably, the second resultant values are written by alternately using increasing addresses and decreasing addresses and the second resultant values are outputted by alternately using the decreasing addresses in symmetry with the write and the increasing addresses.

Exceptionally, the first resultant values firstly calculated from the received sequence are calculated in the reverse order from bits (i.e., L+the remainder obtained by dividing a length of the received sequence by W) and the second resultant values firstly calculated from the received sequence are calculated in the reverse order from the received sequence for a length of the remainder obtained by dividing a length of the received sequence by W to be stored in the reverse order. Also, the third resultant values firstly calculated from the received sequence are calculated in order from the received sequence for a length of the remainder obtained by dividing the length of the received sequence by W.

Accordingly, the present invention considers the characteristic of trellis termination at the last part of the MAP decoding and, thus, has an effect of increasing the coding gain.

Preferably, the output values of the received sequence are determined in a manner that the second resultant values outputted in the reverse order become in the same order as the third resultant values calculated in order.

In still another aspect of the present invention, a method of decoding a received sequence using a Maximum A Posteriori (MAP) algorithm, includes the steps of performing a learning by a backward processing for a predetermined length, calculating and storing second resultant values by the backward processing, calculating third resultant values by a forward processing simultaneously with the learning time of the next window, and determining a decoded bit output using the third resultant values and the second resultant values of the previous window stored before the second resultant values.

Preferably, if a length of the backward or forward processing is W, a length of learning is L, a remainder obtained by dividing the length of the received sequence by W is $W_0$, and N is an integer not less than 1, the learning is performed by the backward processing with symbols of the received sequence number $W_0+NW+L$ to $W_0+NW$, the second resultant values by the backward processing with the symbols of $W_0NW$ to $W_0+(N-1)W$ are stored, the third resultant values by the forward processing with the symbols from $W_0+(N-1)W$ to $W_0+NW$ are calculated simultaneously with the next learning time, and a decoding bit determination is performed with the third resultant values and the second resultant values calculated and stored from $W_0+(N-1)W$ to $W_0+NW$.

However, in case that N is 0, the learning is performed by the backward processing with the symbols of the number of received sequence $W_0+L$ to $W_0$, the second resultant values by the backward processing with the symbols of $W_0$ to 0 are stored and then the third resultant values by the forward processing with the symbols from 0 to $W_0$ are calculated simultaneously with the learning start of the next window to calculate the second resultant values of the next window. Here, the second resultant values are written through one port of a dual-port RAM (DPRAM) and read out through another port thereof. Addresses stored or read out through the ports of the DPRAM are increased or decreased for each length of $W_0$ or W and the addresses stored or read out through the ports of the DPRAM are decreased or increased for each length of $W_0$ or W in a mutually exclusive manner.

Preferably, the decoding bit output is determined in order.

The objects of the present invention may be achieved in whole or in part by an MAP decoder, including a backward processor that calculates first resultant values of an L-bit long sequence and second resultant values of a W-bit long sequence; a forward processor that calculates third resultant values; a memory that stores the second resultant values in a first order and outputs the second resultant values in a second order that is the reverse of the first order; and an output determination module that determines output values of a received sequence using the third resultant values and the outputted second resultant values of the previous window. The L-bit long sequence and W-bit long sequence are portions of the received sequence. The first, second, and third resultant values are state probability values. The calculations of the first and third resultant values overlap in time and the calculation of the first resultant values for the next window is performed after the calculation of the second resultant values is completed.

The objects of the present invention may be further achieved in whole or in part by a method of performing an MAP turbo decoding. The method includes calculating first resultant values of an L-bit long sequence, calculating second resultant values of a W-bit long sequence, calculating third resultant values, storing the second resultant values in a first order and outputting the stored second resultant values in a second order that is the reverse of the first order, and outputting decoded values of a received sequence using the third resultant values and the outputted second resultant values of the previous window. The L-bit long sequence and W-bit long sequence are portions of the received sequence. The first, second, and third resultant values are state probability values. The calculations of the first and third resultant values overlap in time and the calculation of the first resultant values for the next window is performed after the calculation of the second resultant values is completed.

The objects of the present invention may be further achieved in whole or in part by a method of turbo-decoding a received sequence using a Maximum A Posteriori (MAP) algorithm. The method includes performing a learning by a backward processing for a predetermined length, calculating and storing second resultant values obtained by the backward processing, calculating third resultant values by a forward processing that overlaps in time with the next learning, and determining a decoding bit output using the third resultant values and the stored second resultant values of the previous window.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
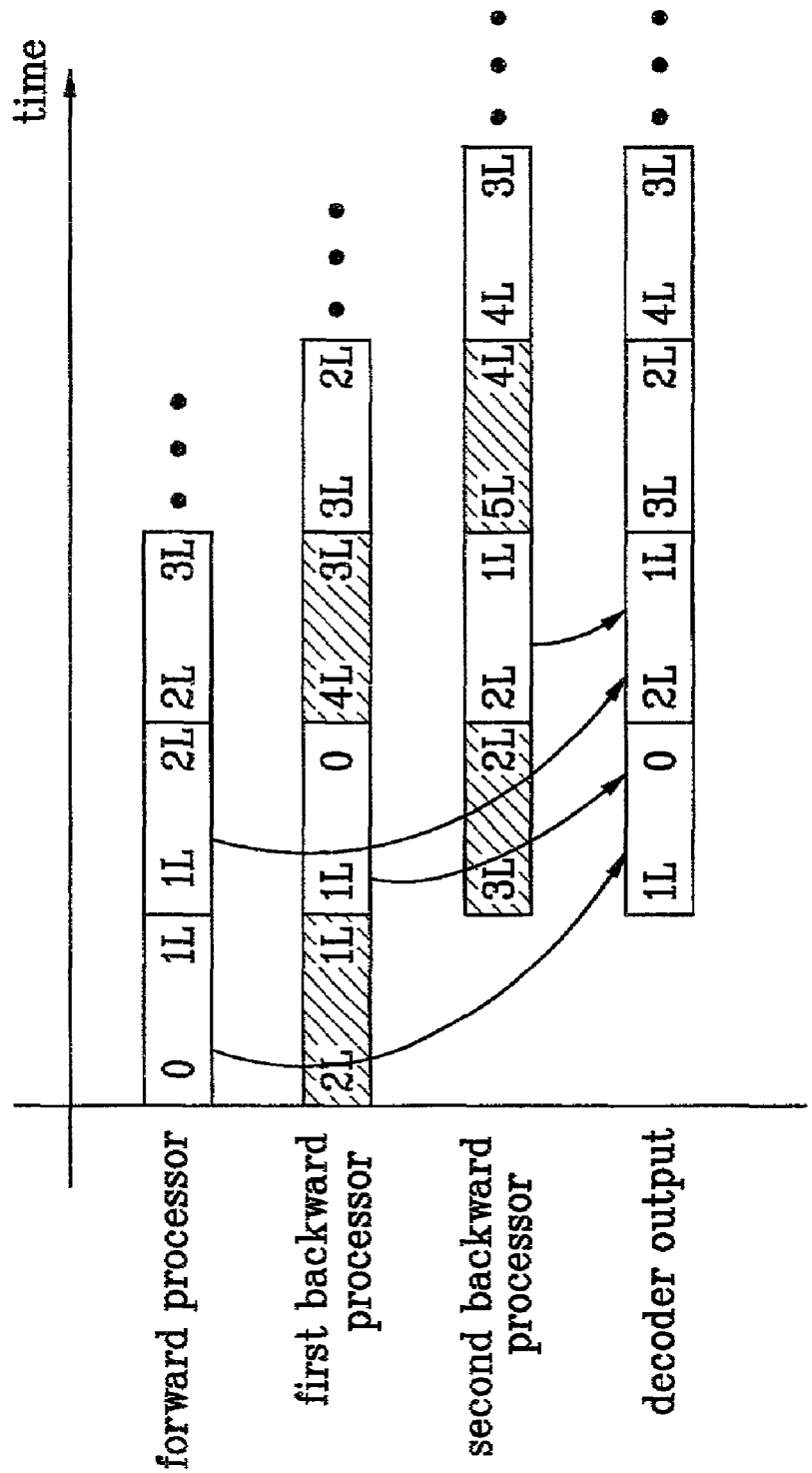
FIG. 1 illustrates a timing diagram of the related art MAP decoding.

As described above, the MAP algorithm is an algorithm that estimates the a posteriori probability of the information bits $P(d_k=1|y)$ and $P(d_k=0|y)$ and then finally obtains the output of the decoder in the form of a log likelihood ratio (LLR) from the estimated probability of the information. The output of the decoder in the LLR form is described by equation 1.

To obtain the a posteriori probability of the information bits, the a posteriori probability of the state shift should be obtained with respect to $P(d_k=1|y)$ and $P(d_k=0|y)$, respectively. The respective a posteriori probability of the state shift can be obtained by the three multiplication terms. The three multiplication terms with respect to the a posteriori probability of the state shift are expressed by equation 2.

Specifically, referring to equation 2, the first term ($\alpha(S_{k-})$) is a joint probability function of the state $S_{k-1}$ that is m' in the received sequence having time indexes from 0 to k−1 and is expressed by the following equation 3.

$$\alpha(S_{k-1})=P(S_{k-1}=m',y_{j<k}) \qquad [\text{Equation 3}]$$

In equation 3, $\alpha(S_k)$ is a joint probability function of the state shift where the state $S_{k-1}$ is m' and the state $S_k$ is m in the received sequence $y_{j<k+1}$, having the sequence numbers from 0 to k, and is expressed by the following equation 4.

$$\alpha(S_k) = \sum_{m'=0}^{M-1} P(S_{k-1} = m', S_k = m, y_{j<k+1})$$ [Equation 4]

The third term in equation 2 $\gamma(S_{k-1}, S_k)$ is a branch metric relating when a state $S_{k-1}$ is shifted to a state $S_k$ and is a conditional probability function where the next state $S_k$ is m, on condition that the state $S_{k-1}$ is m' and the sequence received at that time is $y_k$. It is expressed by the following equation 5.

$$\gamma(S_{k-1}, S_k) = P(S_k = m, y_k | S_{k-1} = m')$$ [Equation 5]

The second term in equation 2 $\beta(S_k)$ is a conditional probability function where the received sequence number $y_{j>k}$ is not less than k+1, on condition that the state $S_k$ is m and is expressed by the following equation 6.

$$\beta(S_k) = P(y_{j>k} | S_k = m)$$ [Equation 6]

In equation 6, $d_k$ represents the information bit sequence before the turbo encoding and $S_k$ represents the state (m={0, 1, ..., M-1}) of the encoder at the number k of the received sequence. $S_k$ has M kinds of states and the input bit $d_k$ changes the state of the encoder from $S_{k-1}$ to $S_k$ when the number of the received sequences is shifted from k-1 to k.

Specifically, in the MAP decoding, $\alpha(S_k)$ can be obtained by a forward recursion method as in the equation 4 and the calculated $\alpha(S_k)$ is directly used for determining the output bits of the decoder. $\alpha(S_k)$ is performed by one forward (alpha) processor.

Also, $\beta(S_k)$ can be obtained by a backward recursion method as in the equation 6. For $\beta(S_k)$ to be used in obtaining the MAP probability, a predetermined period that is called a learning period is required. After this learning period, $\beta(S_k)$, calculated by one backward (beta) processor, is used for determining the output bits of the decoder.

Hereinafter, $\alpha(S_k)$ and $\beta(S_k)$ are called the alpha value and the beta value, respectively.

Figure 2:
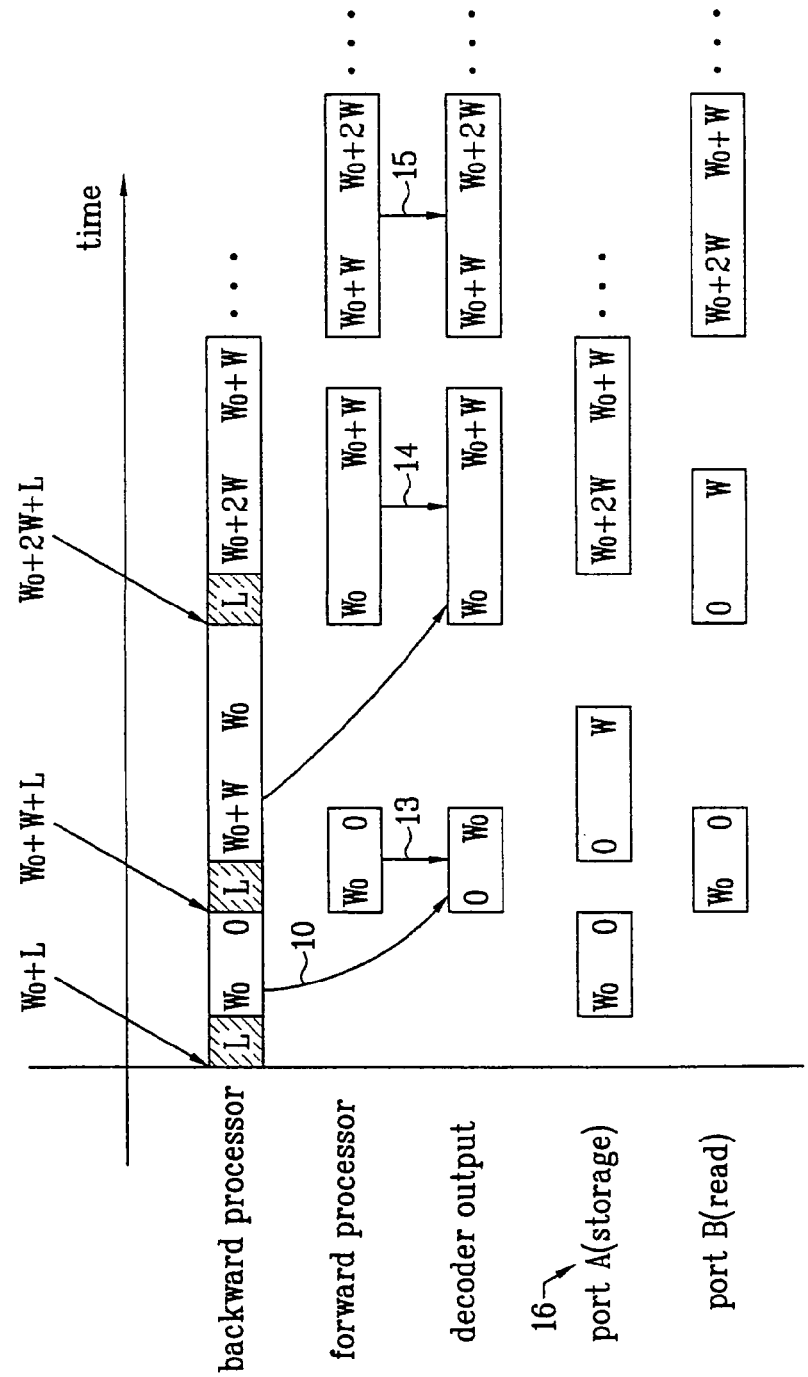
FIG. 2 illustrates a timing diagram of the MAP decoding according to the present invention.

FIG. 2 is a timing diagram of the MAP decoding according to the present invention. The backward processor starts the learning with certain symbols from $W_0+L$ to $W_0$. The learning is performed with a length of L, throughout the MAP decoding. In performing the learning, symbols correspond to the L bits of the received sequence in the same manner as in the related art method. Here, $W_0$ corresponds to the remainder obtained by dividing the length of the received sequence by W.

Next, the beta values 10 are calculated with the symbols from $W_0$ to 0, and then stored in the memory. Here, a dual port random access memory (DPRAM) having different input/output ports is used as the memory.

Next, the learning is started with the symbols from $W_0+W+L$ to $W_0+W$. Then, the beta values 11 are calculated with the symbols from $W_0+W$ to $W_0$ to be stored in the memory.

Simultaneously with the start of learning with the symbols from $W_0+W+L$ to $W_0+W$, the forward processor calculates the alpha values 13 with the symbols from 0 to $W_0$ and determines the output bits of the decoder using the calculated alpha values 13 and the beta values 10 from $W_0$ to 0, which were stored by the backward processor. The calculation of the alpha 14–15 and beta 11–12 values is performed for the length of W.

Next, the learning process is started with symbols from $W_0+2W+L$ to $W_0+2W$. Then, the beta values 12 are calculated with the symbols from $W_0+2W$ to $W_0+W$ to be stored in the memory.

Simultaneously with the start of learning with symbols from $W_0+2W+L$ to $W_0+2W$, the forward processor calculates the alpha values 14 with the symbols from $W_0$ to $W_0+W$ and determines the output bits of the decoder using the calculated alpha values 14 and the beta values 11 from $W_0+W$ to $W_0$, which were stored by the backward processor.

As described above, by repeating the learning, backward processing, forward processing, and decoding, the MAP decoding for one code block (for convenience' sake, it has been called a received sequence, the length of which is called one code block size) is completed.

Meanwhile, in two lower lines of FIG. 2, addresses of the dual port RAM (DPRAM) for storing the beta values that are results of the backward processing are illustrated. The beta values are stored through port A and are read out through port B.

However, the beta values calculated during the learning period are not stored.

The beta values 10 calculated from $W_0$ to 0 are stored in the order of the addresses decreasing from $W_0$ to 0, through port A, and then read out in the order of the addresses increasing from 0 to $W_0$, through port B, so that the read beta values 10 are used for determining the output bits of the decoder along with the alpha values 13 calculated from 0 to $W_0$.

Also, the beta values 11 calculated from $W_0+W$ to $W_0$ are stored in the order of the addresses increasing from 0 to W, through port A, and then read out in the order of the addresses decreasing from W to 0, through port B, so that the read beta values 11 are used for determining the output bits of the decoder along with the alpha values 14 calculated from $W_0$ to $W_0+W$.

Specifically, ports A and B store and read the beta values calculated for the predetermined length in the order of the increasing or decreasing addresses. In case that the beta values have been stored in the order of the increasing addresses through port A, they are read out in the order of the decreasing addresses through port B. In case that they have been stored in the order of the decreasing addresses, they are read out in the order of the increasing addresses through port B.

That is, ports A and B input/output the values in the order of the increasing or decreasing addresses on a mutually exclusive manner.

If the addresses being used proceed always in the same direction (i.e., if it is repeated that the addresses of port A are decreased from W or $W_0$ to 0 and the addresses of port B are increased from 0 to W or $W_0$), the stored beta values are updated with new values before the stored beta values have been read out for use in determining the decoder output. In order to prevent this, the size of the memory for storing the beta values should be doubled or the method proposed according to the present invention should be used.

According to the present invention, one backward processing starts from $W_0+NW+L$ (N=0,1,2, ...) and this start point is increased by W for each subsequent sliding window. Also, the end point of the backward processing is $W_0+NW$ (N=0,1,2, ...) or 0, and is also increased by W. In performing the learning, symbols correspond to the L bits of the received sequence in the same manner as in the related art method.

$W_0$ is determined by the equation T mod W, where T is the length of the received sequence and "mod" refers to modulo calculation. However, if the result of the modulo calculation is 0, W is used instead.

For example, if the length of the received sequence is 3840 bits and W is 256, $W_0$ is determined to be 256, which is equal to W. If the length T of the received sequence is 3841 bits, $W_0$ becomes 1. As $W_0$ is determined as described above, the final unit of the backward processing will be always W. By doing this, the property of the turbo codes that use the trellis termination (3 GPP TS25.212 V2.2.1 Turbo Coding section, October 1999) such as 3 GPP WCDMA can be effected at maximum.

This is the same concept that when the convolutional codes using tail bits are decoded by a Viterbi decoder, just the very last trace-back depth of the code block starts from the state 0 and is decoded at a time.

For example, if it is determined that W is 256, one bit remains in the code block of 3841 bits, and it may be considered that the one bit is processed in the very first window according to the present invention or in the very last window. Since the termination characteristic can be used at the end of each code block, a better decoding performance can be obtained by decoding 256 bits, rather than by decoding one bit, using the termination characteristic.

With regard to the size of the memory required for the MAP decoding, the conventional method requires about 60 depth, while the decoder according to the present invention uses 256 depth. However, there may be no difference in implementing the actual circuit since the minimum depth of an internal block RAM of a "Xilinx Virtex" chip used for implementing the present invention is 256.

As described above, the present invention uses only one backward processor and thus the size of circuit and the amount of calculation (i.e., power consumption) can be reduced.

Also, a better decoding performance can be achieved by effecting the characteristic of trellis termination by filling the last window.

Also, since the decoding results can be obtained in order, the memory and the circuit required for the LIFO can be removed and the power consumption can be reduced.

Also, by adjusting the read/write addresses of the dual port RAM for storing the beta values, the size of the memory can be reduced by half.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. An MAP decoder, comprising:
a backward processor that calculates first resultant values of an L-symbol long sequence and second resultant values of a W-symbol long sequence;
a forward processor that calculates third resultant values;
a memory that stores the second resultant values in a first order and outputs the second resultant values in a second order that is the reverse of the first order; and
an output determination module that determines output values of a received sequence using the third resultant values and the outputted second resultant values of a previous window, wherein
the L-symbol long sequence and the W-symbol long sequence are portions of the received sequence,
the first, second, and third resultant values are state probability values,
the calculations of the first and third resultant values overlap in time, and
the calculation of the first resultant values for the next window is performed after the calculation of the second resultant values is completed; where L and W are integers.

2. The MAP decoder of claim 1, wherein the memory stores a plurality of groups of the second resultant values by alternately using increasing and decreasing sequential addresses to store subsequent groups of the second resultant values.

3. The MAP decoder of claim 1, wherein the memory repeatedly writes newly calculated second resultant values and reads the stored second resultant values by alternately using: (1) increasing sequential addresses for the write operation and decreasing sequential addresses for the read operation and (2) decreasing sequential addresses for the write operation and increasing sequential addresses for the read operation, as the write and read operations are applied to each of a plurality of groups of the second resultant values.

4. The MAP decoder of claim 1, wherein:
the received sequence has a symbol length of symbols;
each of the first resultant values corresponds to an input value of the L-symbol long sequence;
each of the first resultant values is calculated in a sequential order that is the reverse of the order of receipt of the corresponding input value; and
a first calculated value in the ordered sequence of the first resultant values corresponds to the $i^{th}$ symbol received in the received sequence, where i is identified by the equation i=L+(T mod W) and (T mod W) is modulo division providing the remainder of the division; where T is an integer.

5. The MAP decoder of claim 1, wherein:
the received sequence has a symbol length of T symbols;
each of the second resultant values corresponds to an input value of the W-symbol long sequence;
each of the second resultant values is calculated in a sequential order that is the reverse of the order of receipt of the corresponding input value; and
a first calculated value in the ordered sequence of the second resultant values corresponds to the $j^{th}$ symbol received in the received sequence, where j is identified by the equation j=(T mod W) and (T mod W) is modulo division providing the remainder of the division; where T is an integer.

6. The MAP decoder of claim 1, wherein:
the received sequence has a symbol length of T symbols;
each of the third resultant values corresponds to an input value of the W-symbol long sequence;
each of the third resultant values is calculated in the order of receipt of the corresponding input value; and
a last calculated value in the ordered sequence of the third resultant values corresponds to the $k^{th}$ symbol received in the received sequence, where k is identified by the equation k=(T mod W) and (T mod W) is modulo division providing the remainder of the division; where T is an integer.

7. The MAP decoder of claim 3, wherein:
each of the output values corresponds to an input value of the W-symbol long sequence; and
the output determination module outputs each of the output values in the same order as the order of receipt of the corresponding input value of the W-symbol long sequence.

8. A method of performing an MAP turbo decoding, comprising:
calculating first resultant values of an L-symbol long sequence;
calculating second resultant values of a W-symbol long sequence;
calculating third resultant values of the W-symbol long sequence;
storing the second resultant values in a first order and outputting the stored second resultant values in a second order that is the reverse of the first order; and
outputting decoded values of a received sequence using the third resultant values and the outputted second resultant values of a previous window, wherein
the L-symbol long sequence and W-symbol long sequence are portions of the received sequence,
the first, second, and third resultant values are state probability values,
the calculations of the first and third resultant values overlap in time, and
the calculation of the first resultant values for the next window is performed after the calculation of the second resultant values is completed; where W and L are integers.

9. The method of claim 8, further comprising writing a plurality of groups of the second resultant values by alternately using increasing and decreasing sequential addresses to write subsequent groups of the second resultant values.

10. The method of claim 8, further comprising:
repeatedly writing newly calculated second resultant values and reading the stored second resultant values by alternately using: (1) increasing sequential addresses for the write operation and decreasing sequential addresses for the read operation and (2) decreasing sequential addresses for the write operation and increasing sequential addresses for the read operation, as the write and read operations are applied to each of a plurality of groups of the second resultant values.

11. The method of claim 8, wherein:
the received sequence has a symbol length of T symbols;
each of the first resultant values corresponds to an input value of the L-symbol long sequence;
each of the first resultant values is calculated in a sequential order that is the reverse of the order of receipt of the corresponding input value; and
a first calculated value in the ordered sequence of the first resultant values corresponds to the $i^{th}$ symbol received in the received sequence, where i is identified by the equation i=L+(T mod W) and (T mod W) is modulo division providing the remainder of the division; where T is an integer.

12. The method of claim 8, wherein:
the received sequence has a symbol length of T symbols;
each of the second resultant values corresponds to an input value of the W-symbol long sequence;
each of the second resultant values is calculated in a sequential order that is the reverse of the order of receipt of the corresponding input value; and
a first calculated value in the ordered sequence of the second resultant values corresponds to the $j^{th}$ symbol received in the received sequence, where j is identified by the equation j=(T mod W) and (T mod W) is modulo division providing the remainder of the division; where T is an integer.

13. The method of claim 8, wherein:
the received sequence has a symbol length of T symbols;
the W-symbol long sequence is a portion of the received sequence;
each of the third resultant values corresponds to an input value of the W-symbol long sequence;
each of the third resultant values is calculated in the order of receipt of the corresponding input value; and
a last calculated value in the ordered sequence of the third resultant values corresponds to the $k^{th}$ symbol received in the received sequence, where k is identified by the equation k=(T mod W) and (T mod W) is modulo division providing the remainder of the division; where T is an integer.

14. The method of claim 8, wherein:
each of the decoded values corresponds to an input value of the W-symbol long sequence; and
the decoded values are output in the same order as the order of receipt of the corresponding input value of the W-symbol long sequence.

15. A method of turbo-decoding a received sequence using a Maximum A Posteriori (MAP) algorithm, comprising:
performing a learning by a backward processor for a predetermined length;
calculating and storing first resultant values obtained by the backward processor;
calculating second resultant values by a forward processor that overlaps in time with the next learning; and
determining a decoding symbol output using the second resultant values and the stored first resultant values of a previous window,
wherein if a processing length of the backward processor is W, and a length of a received bit sequence is K, a length of a first data block $W_0$ to be processed is determined by the equation KmodW; where W, $W_0$, and K are integers.

16. The turbo-decoding method of claim 15, wherein if a processing length of the backward or forward processor is W, a length of learning is L, and N is an integer not less than 1 and L is and integer,
the learning is performed by the backward processor on sequential symbol portions of the received sequence identified by the range $W_0$+NW+L to $W_0$+NW;
the first resultant values calculated by the backward processor on sequential symbol portions identified by the range of the received sequence $W_0$+NW to $W_0$+(N−1)W are stored;
the second resultant values calculated by the forward processor on the sequential symbol portions of the received sequence identified by $W_0$+(N−1)W to $W_0$+NW; and
the decoding symbol determination is performed with the second resultant values and the first resultant values based on the sequential symbol portions of the received sequence identified by the range $W_0$+(N−1)W to $W_0$+NW.

17. The turbo-decoding method of claim 15, wherein if a processing length of the backward or forward processor is W, a length of learning is L, and L is an integer;
the learning is performed by the backward processor on sequential symbol portions of the received sequence identified by the range $W_0$+L to $W_0$;

the second first resultant values calculated by the backward processor on sequential symbol portions of the received sequence identified by the range $W_0$ to 0 are stored; and the second resultant values calculated by the forward processor on the sequential symbol portions of the received sequence identified by the range 0 to $W_0$ are calculated during a period overlapping in time simultaneously the learning performed in the next window.

18. The turbo-decoding method of claim 15, wherein the first resultant values are written through one port of a dual-port RAM (DPRAM) and are read out through another port thereof.

19. The method of claim 15, further comprising writing a plurality of groups of the first resultant values by alternately using increasing and decreasing sequential addresses to store subsequent groups of the first resultant values.

20. The method of claim 15, further comprising:
repeatedly storing newly calculated first resultant values and reading the stored first resultant values by alternately using: (1) increasing sequential addresses for the store operation and decreasing sequential addresses for the read operation and (2) decreasing sequential addresses for the store operation and increasing sequential addresses for the read operation, as the write and read operations are applied to each of a plurality of groups of the first resultant values.

21. The method of claim 15, further comprising:
outputting a plurality of the decoding symbol outputs as decoded values, wherein each of the decoded values corresponds to an input value of a W-symbol long sequence; and the decoded values are output in the same order as the order of receipt of the corresponding input value of the W-symbol long sequence.

22. The turbo-decoding method of claim 15, wherein if a result of the module calculation equals 0, $W_0=W$ such that a final processed block by the backward processor will be equal to W.

23. A Maximum A Posteriori (MAP) decoder in a receiving end that performs an iterative decoding, the MAP decoder comprising:

a backward processor for learning for a predetermined length L and calculating first state probability values for a window length of $W_0$ of a received sequence from $W_0$ to 0 or for a window length W of a received sequence from $W_0+(N+1)W$ to $W_0+NW$ after the predetermined length L;

a forward processor for calculating second state probability values for a window length of $W_0$ of the received sequence from 0 to $W_0$ or for a window length of W from $W_0+NW$, wherein N, W, $W_0$, and L are integers;

a memory means for storing in a first order the first state probability values and outputting in a reverse of the first order the state probability values; and an output determination means for determining output values of the received sequence using first state probability values and second state probability values, wherein $W_0$ is determined based on a code block size and the window length W.

24. A method of performing a Maximum A Posteriori (MAP) turbo decoding in a receiving end that performs an iterative decoding, the method comprising:

learning for a predetermined length L and calculating first state probability values for a window length of $W_0$ of a received sequence from $W_0$ to 0 or for a window length W of a received sequence from $W_0+(N+1)W$ to $W_0+NW$ after the predetermined length L;

calculating second state probability values for a window length of $W_0$ of the received sequence from 0 to $W_0$ or for a window length of W from $W_0$ to $W_0+(N+1)W$, wherein N, W, $W_0$, and L are integers;

storing in a first order the first state probability values and outputting in a reverse of the first order the first state probability values; and determining output values of the received sequence using first state probability values and second state probability values, wherein $W_0$ is determined based on a code block size and the window length W.

25. The method of turbo-decoding a received sequence using a Maximum A Posteriori (MAP) algorithm, the method comprising:

performing a backward processing by learning for a predetermined length L and calculating first resultant values for a first processing length $W_0$ or a second processing length W after the predetermined length L;

storing the first resultant values;

performing a forward processing by calculating second resultant values for a first processing length $W_0$ or the second processing length;

determining a decoding output using the first resultant values and the second resultant values, wherein the $W_0$ is a remainder obtained by dividing a received sequence by the second processing length W, wherein W, $W_0$, and are integers.

* * * * *